United States Patent [19]

Ishizawa et al.

[11] Patent Number: 4,926,175
[45] Date of Patent: May 15, 1990

[54] ANALOG-DIGITAL CONVERTING CIRCUIT HAVING HIGH RESOLUTION AND LOW POWER CONSUMPTION

[75] Inventors: Yoshiro Ishizawa; Hiroshi Morito, both of Tokyo, Japan

[73] Assignee: NEC Corporation, Japan

[21] Appl. No.: 341,563

[22] Filed: Apr. 20, 1989

[30] Foreign Application Priority Data

Apr. 20, 1988 [JP] Japan .................. 63-98702

[51] Int. Cl.⁵ .............................. H03M 1/20
[52] U.S. Cl. ...................... 341/131; 341/141
[58] Field of Search ........... 341/131, 141, 155, 126

[56] References Cited

U.S. PATENT DOCUMENTS

| 3,792,352 | 2/1974 | Metcalf et al. | 341/131 X |
| 3,882,488 | 5/1975 | Kosakowski et al. | 341/131 |
| 4,321,583 | 3/1982 | Baron et al. | 341/141 X |

Primary Examiner—William M. Shoop, Jr.
Assistant Examiner—Sharon D. Logan
Attorney, Agent, or Firm—Ostrolenk, Faber, Gerb & Soffen

[57] ABSTRACT

An analog-digital converting circuit comprises an analog amplifying circuit having different amplification factors and an input connected to an analog signal input terminal. A first selector is connected at a corresponding number of inputs to receive the plurality of amplified analog signals, respectively. The first selection circuit outputs one analog signal selected from the received amplified analog signals, to an analog-digital converter. A second selector is connected at its an input to receive a digital signal from the analog-digital converter and has a plurality of outputs for outputting the received digital signal from one sequentially alternatively selected from the plurality of outputs. A coefficient multiplying circuit is connected to the outputs of the second selector, and generates multiplied digital signals obtained by multiplying the outputs of the second selector by different coefficeints. A third selector is connected at its corresponding number of inputs to the plurality of outputs of the coefficient multiplying circuit so as to output, as a digital signal, one selected from the plurality of outputs of the coefficient multiplying circuit. A controller is connected to receive the plurality of outputs of the second selector for monitoring respective levels of the plurality of outputs of the second selector and for supplying a selection signal to the third selector so as to cause to select, from the plurality of outputs of the coefficient multiplying circuit, one multiplied digital signal in correspondence to a level of the analog signal inputted to the analog signal input terminal.

4 Claims, 7 Drawing Sheets

ANALOG-DIGITAL CONVERTING CIRCUIT HAVING HIGH RESOLUTION AND LOW POWER CONSUMPTIONy

BACKGROUND OF THE INVENTION

1. Field of the Invention

The present invention relates to an analog-digital converting circuit, and more specifically to an analog-digital converting circuit which uses an analog-digital converter of a low resolution but can attain a high resolution.

2. Description of Related Art

Hitherto, for attaining analog-digital conversion (called "A/D conversion" hereinafter) at a high resolution, an A/D converter having a high resolution has been required. FIG. 1 illustrates one typical A/D converting circuit, which includes an A/D converter 10 having an input terminal 12 connected to receive an analog signal and a clock input connected to receive a sample clock 14 from a sample clock generator 16. The A/D converter 10 generates at its output terminal 18 a digital signal in the format of parallel bits, for example 10 bits.

The A/D converter 10 operates to convert the analog signal inputted to the input terminal 12, into the digital signal, in synchronism with the sample clock 14 supplied from the sample clock generator 16. In this A/D conversion circuit, in order to obtain a A/D conversion having a high resolution, the A/D converter 10 has to have a resolution higher than a required resolution.

However, the A/D converter having a high resolution is expensive in cost and very large in required consuming current. Therefore, it has been difficult to incorporate a high resolution A/D conversion circuit, into instruments required to be a lower power consumption, for example, a handy camera integrally combined with a magnetic recording/reproducing device.

SUMMARY OF THE INVENTION

Accordingly, it is an object of the present invention to provide an A/C converting circuit which has overcome the above mentioned defect of the conventional one.

Another object of the present invention is to provide an A/D converting circuit of a high resolution and a low power consumption.

A further object of the present invention is to provide an A/D converting circuit which uses an analog-digital converter of a low resolution but can attain a high resolution.

The above and other objects of the present invention are achieved in accordance with the present invention by an analog-digital converting circuit comprising an analog signal input terminal; analog amplifying means having an input connected to the analog signal input terminal and having a plurality of outputs for generating a corresponding number of analog signals amplified by different amplification factors; first selection means having a corresponding number of inputs connected to receive the plurality of amplified analog signals outputted from the analog amplifying means, respectively, and having an output for outputting one analog signal selected from the received amplified analog signals; an analog-digital converter having an input connected to receive the amplified and selected analog signal and having an output for generating a digital signal; second selection means having an input connected to receive the distal signal from the analog-digital converter and having a plurality of outputs for outputting the received digital signal from one sequentially alternatively selected from the plurality of outputs; a sample clock generator for supplying a sample clock to the first and second selection means and the analog-digital converter so as to cause the first and second selection means and the analog-digital converter to operate in a manner timed to each other; coefficient multiplying means having a corresponding number of inputs connected to the plurality of outputs of the second selection means, respectively, and having a plurality of outputs for generating a corresponding number of multiplied digital signals which are obtained by the plurality of outputs of the second selection means by different coefficients, respectively; a third selection means having a corresponding number of inputs connected to the plurality of outputs of the coefficient multiplying means so as to output, as a digital signal, one selected from the plurality of outputs of the coefficient multiplying means; and a controller having a corresponding number of inputs connected to the plurality of outputs of the second selection means, respectively, for monitoring respective levels of the plurality of outputs of the second selection means and for supplying a selection signal to the third selection means so as to cause to select, from the plurality of outputs of the coefficient multiplying means, one multiplied digital signal in correspondence to a level of the analog signal inputted to the analog signal input terminal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
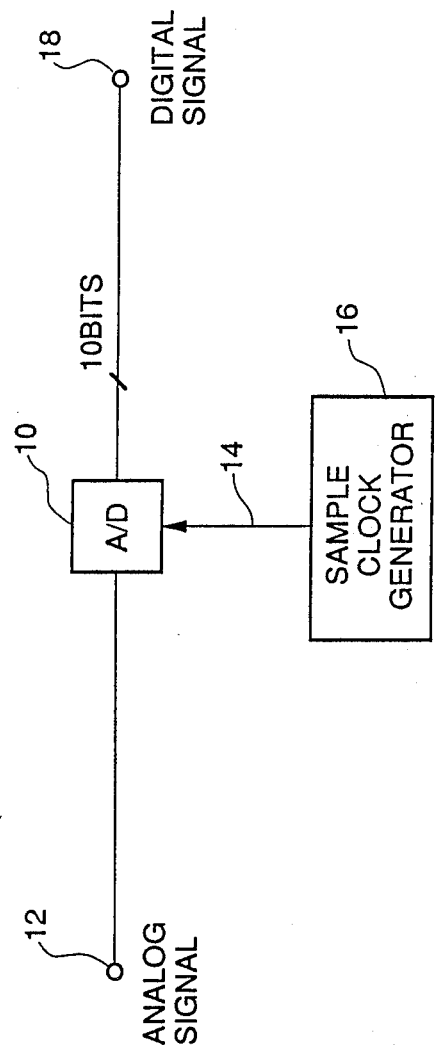
FIG. 1 is a block diagram of a conventional A/D converting circuit.
Figure 2:
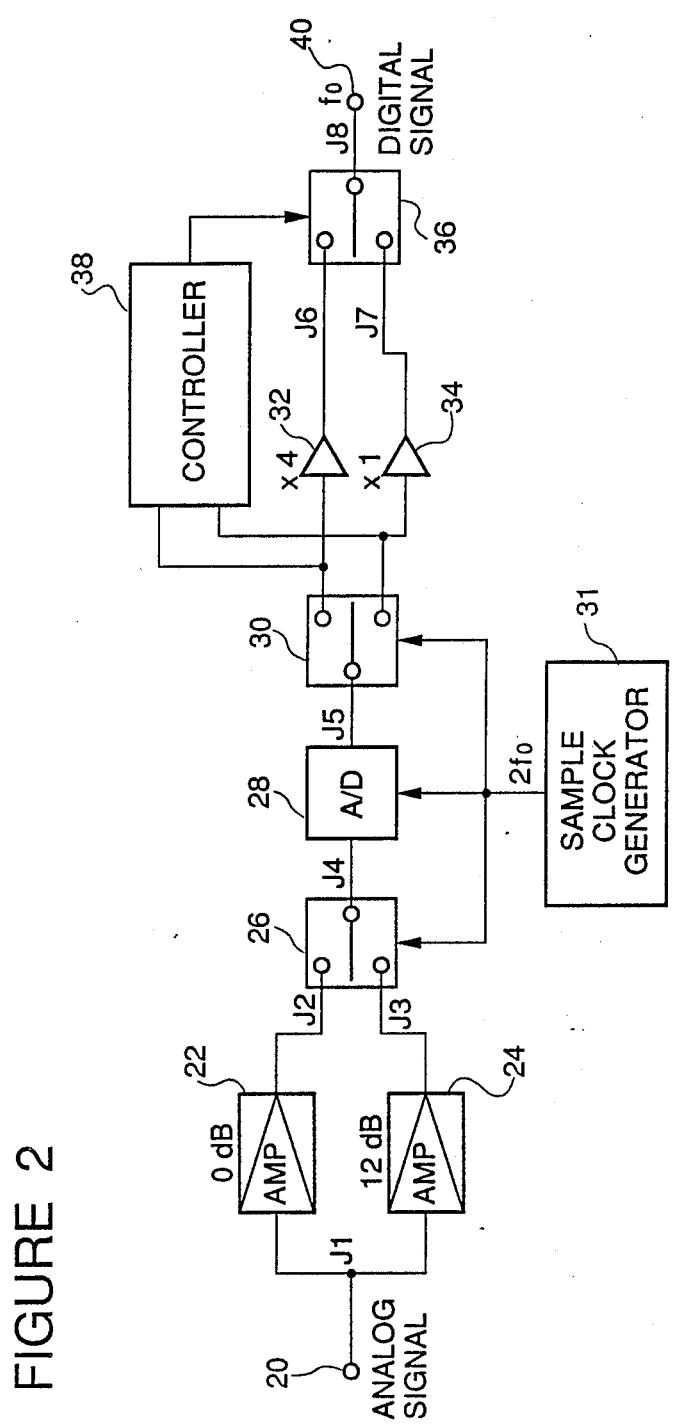
FIG. 2 is a block diagram of a first embodiment of the A/D converting circuit in accordance with the present invention.

Referring to FIG. 2, there is shown a block diagram of a first embodiment of the A/D converting circuit in accordance with the present invention. The shown A/D converting circuit includes an analog signal input terminal 20 and first and second analog amplifiers 22 and 24 each having an input connected to the analog signal input terminal 20. Outputs of first and second analog amplifiers 22 and 24 are connected to a pair of inputs of a first selector or multiplexor 26, which is in turn connected at its output to an input of an A/D converter 28. An output of the A/D converter 28 is connected to a second selector or demultiplexor 30 having first and second outputs.

The multiplexor 26, the A/D converter 28 and the demultiplexor 30 are connected to receive a sample clock of a frequency $2f_o$ from a sample clock generator 31, so that the A/D converter 28 operates to sample an received analog signal in synchronism with the sample clock $2f_o$ for generating a digital signal, and on the other hand, the multiplexor 26 and the demultiplexor 30 perform their multiplexing and demultiplexing in synchronism with the sample clock $2f_o$. Namely, the multiplexing operation of the multiplexor 26 is timed in phase with the demultiplexing operation of the demultiplexor 30.

The first and second outputs of the demultiplexor 30 are connected to inputs of first and second multipliers 32 and 34, respectively, which are in turn connected at their outputs to a pair of inputs of a third selector 36, respectively. Further, the first and second outputs of the demultiplexor 30 are connected to a controller 38, which generates a selection signal to a control input of the selector 36. The selector 36 operates to select one of its two inputs under the control of the selection signal of the controller 40, and to generate a digital signal onto a digital output terminal 40.

Now, assume that the digital signal outputted on the terminal 40 is required to have a resolution of 10 bits but the A/D converter 28 has only the resolution of 8 bits. In this case, if the first amplifier is set to have a gain of 0 dB, the second amplifier 24 is set to have a gain of 12 dB. On the other hand, if the first multiplier 32 has a multiplication factor of 4, and the second multiplier 34 has a multiplication factor of 1.

The multiplexor 26 and the demultiplexor 30 are timed to each other by the sample clock $2f_o$ so that, when the 0 dB amplifier 22 is selected by the multiplexor 26, the output of the A/D converter 28 is supplied to the (x 4) multiplier 32 by the demultiplexor 30, and when the 12 dB amplifier 24 is selected by the multiplexor 26, the output of the A/D converter 28 is supplied to the (x 1) multiplier 34 by the demultiplexor 30. Therefore, if the input analog signal 20 is at a constant level, the outputs of the two multipliers 32 and 34 have substantially the same level.

The controller 38 operates to compare one of the two output signals of the demultiplexor 30 with a digital reference level in order to determine whether or not a level of the input analog signal is larger than a analog reference level. The controller 38 causes the selector 36 to select the output of the (x 1) multiplier 34 when it is judged that the input analog signal level is not greater than the reference level and the output of the (x 4) multiplier 32 when the input analog signal level is greater than the reference level.

Figure 3A:
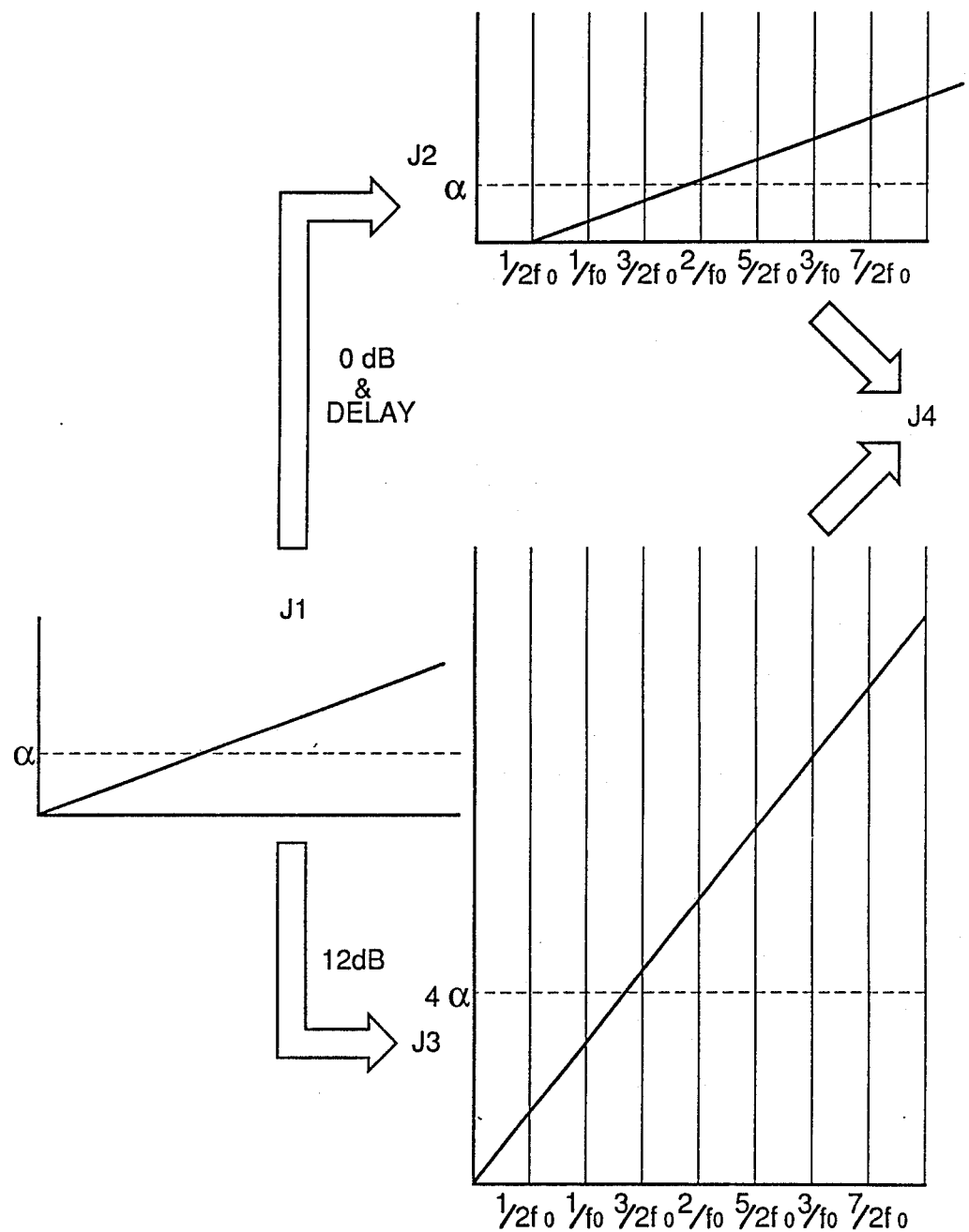
FIGS. 3A to 3D illustrate an A/D conversion process in the embodiment shown in FIG. 2.
Figure 3B:
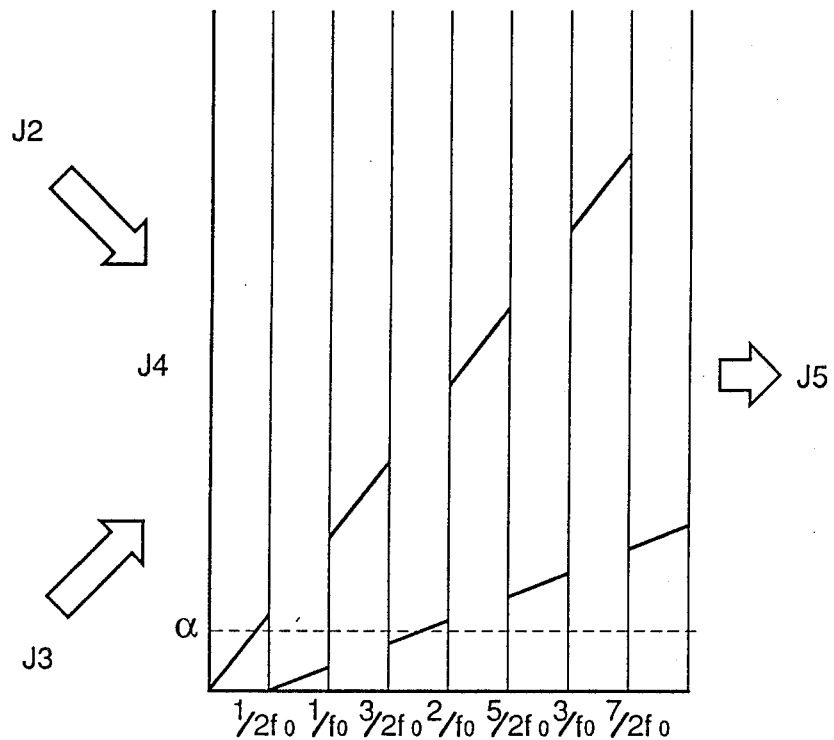
Figure 3C:
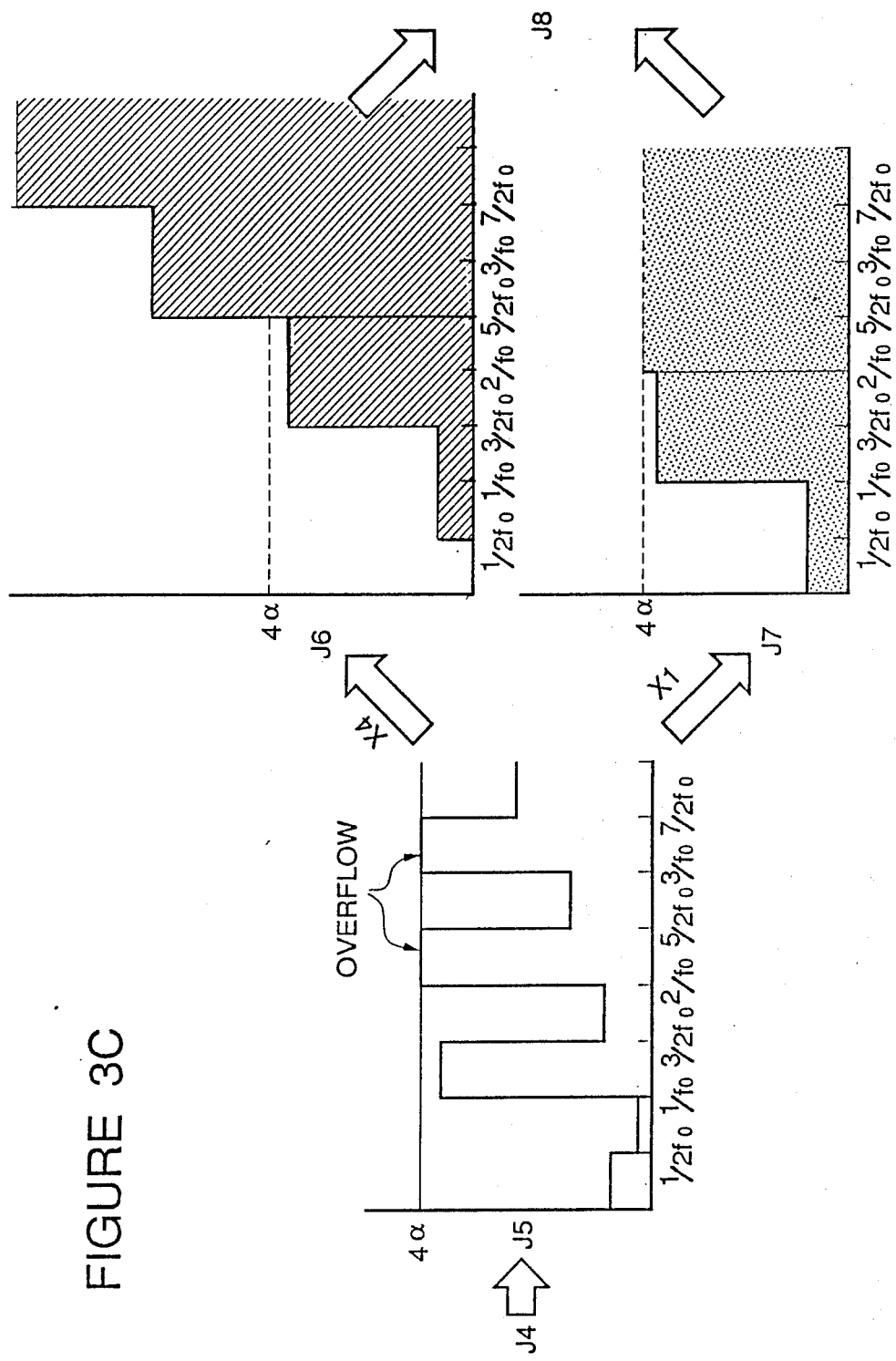
Figure 3D:
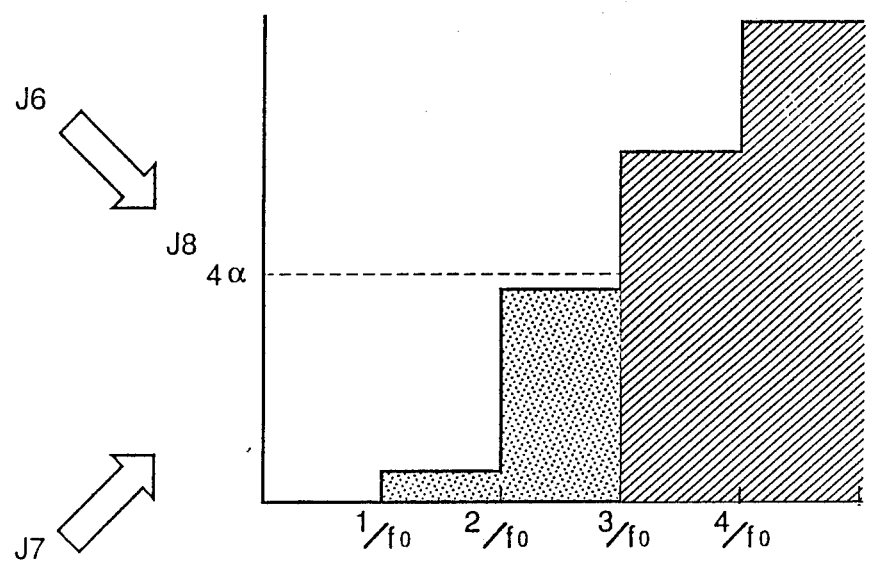

Now, an example of the operation of the A/D converting circuit shown in FIG. 2 will be explained with reference to FIGS. 3A to 3D, which illustrate an A/D conversion process in the embodiment shown in FIG. 2. Assuming that an original analog signal as shown in a graph J1 of FIG. 3A is inputted to the input terminal 20, the original analog signal J1 is amplified by 0 dB in the amplifier 22 and delayed by a period of $\frac{1}{2}f_o$ as shown in a graph J2. At the same time, the original analog signal J1 is amplified by 12 dB in the amplifier 24 without delay as shown in a graph J3.

These amplified analog signals J2 and J3 are alternately selected by the multiplexor 26 in synchronism with the sample clock $2f_o$. Namely, the multiplexor 26 outputs a multiplexed analog signal as shown in a graph J4 of FIG. 3B. This multiplexed analog signal J4 is sampled by the A/D converter 28 at a sampling frequency $2f_o$ and converted into a digital signal of 8-bits, as shown in a bar graph J5 of FIG. 3. In the graph J5, the height of respective bars indicate the magnitude of respective digital value. Here, if the original analog signal J1 exceeds a reference level "α" which corresponds to one fourth of a peak-to-peak level of the analog signal J1, the A/D conversion of the signal amplified by the 12 dB amplifier 24 will generates an overflow, as seen from the bar graph J5. In other words, the maximum value of the digital signal generated by the A/D converter 28 is a digital value corresponding to 4α.

The digital signal J5 is alternately supplied to the (x 4) multiplier 32 or the (x 1) multiplier 34 in synchronism with the sample clock $2f_o$ so that the 12 dB amplified and digitized signal is supplied to the (x 1) multiplier 34 and the 0 dB amplified and digitized signal is supplied to the (x 4) multiplier 32. The (x 4) multiplier 32 operates to leftward shift the received 8-bit digital signal by two bits and to add "00" to two blanked LSB bits so as to generate a 10-bit digital output signal. On the other hand, the (x 1) multiplier 34 operates to place the received 8-bit digital signal to lower 8 bits of a 10-bit signal and to place "00" to two MSB bits of the 10-bit signal so as to generate a 10-bit digital output signal. Each of the multipliers 32 and 34 receives the digital signal for a period of $\frac{1}{2}f_o$, but maintains its output for each period of $1/f_o$ until a next digital signal is inputted, as seen from bar graphs J6 and J7 of FIG. 3.

The controller 38 monitors the two outputs of the demultiplexor 30. Specifically, the controller 38 compares the input of the (x 4) multiplier 32 with a digital reference value corresponding to the analog reference level "α". Otherwise, the controller 38 compares the input of the (x 1) multiplier 34 with a digital reference value corresponding to a level which is four times as large as the analog reference level "α". As a result, when the controller 38 judges that the original analog signal 20 is larger than the analog reference level "α", the controller 38 causes the selector 36 to select the output of the (x 4) multiplier 32. On the other hand, when the controller 38 judges that the original analog signal 20 is not larger than the analog reference level "α", the controller 38 causes the selector 36 to select the output of the (x 1) multiplier 34. As a result, the selector 36 generates the 10-bit digital signal as shown in a bar graph J8 of FIG. 3D.

Thus, the 10-bit digitized signal can be obtained with a sample clock $f_o$ by using the A/D converter 28 having the resolution of 8-bits.

In the above mentioned embodiment, the required resolution of the digitized signal is 10-bits and the A/D converter 28 has the resolution of 8-bits. However, if the A/D converter 28 has the resolution of 9-bits for the required resolution of 10-bits, the analog amplifier 24 should have a gain of 6 dB, and the multiplier 32 should have a multiplication factor of "2". In this case, the multiplier 32 operates to leftward shift the received 9-bit digital signal by one bit and to add "0" to a blanked LSB bit so as to generate a 10-bit digital output signal, and the multiplier 34 operates to place the received 9-bit digital signal to lower 9 bits of a 10-bit signal and to place "0" to a MSB bit of the 10-bit signal so as to generate a 10-bit digital output signal. The analog reference level a is set to correspond to a half of the peak-to-peak level of the original analog level.

Figure 4:
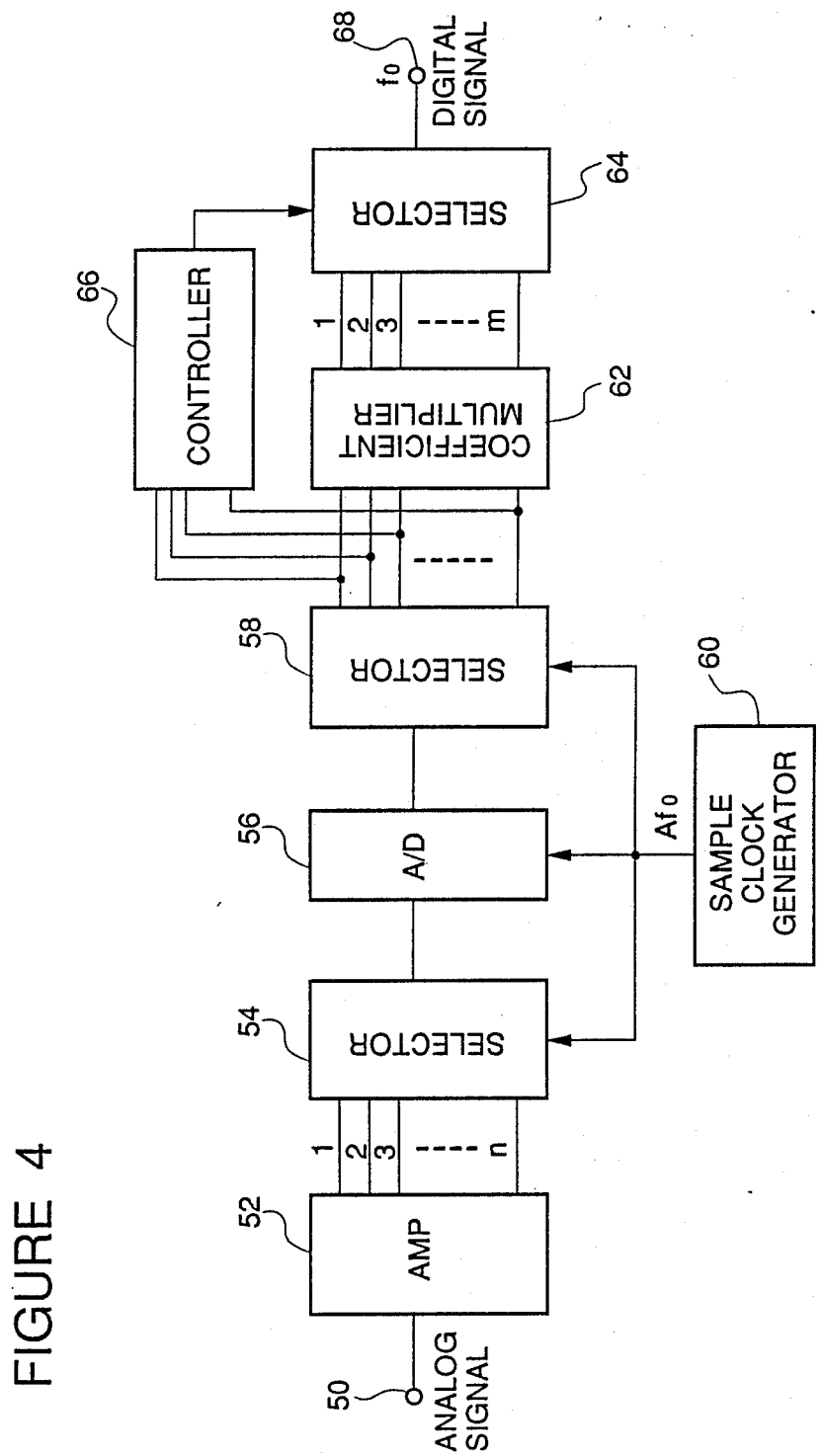
FIG. 4 is a block diagram of a second embodiment of the A/D converting circuit in accordance with the present invention.

Turning to FIG. 4, there is shown, in a generalized form, the A/D converting circuit in accordance with the present invention. The shown A/D converting circuit comprising an analog signal input terminal 50 and an analog amplifier section 52 having an input connected to the analog signal input terminal 50. This analog amplifier section 52 has "n" outputs which generates analog signals amplified by different amplification factors, respectively, and are connected to a corresponding number of inputs of a first selector 54 (where "n" is integer). The first selector 54 operates to output one analog signal selected from the received amplified analog signals. The output of the first selector 54 is connected to an A/D converter 56 for generating a digital signal at its output. The output of the A/D converter 56 is connected to a second selector 58 having "m" outputs which are such that the received digital signal is outputted from one alternatively selected from the "m" outputs (where "m" is integer). The first selector 54, the A/D converter 56 and the second selector 58 are timed to each other in synchronism with a sample clock of a frequency $Af_o$ supplied from a sample clock generator 60 (where "A" is integer and "$f_o$" is a sample frequency of an digitized output signal of the A/D converting circuit shown in FIG. 4).

The "m" outputs of the second selector 58 are connected to a controller 66 and a coefficient multiplying circuit 62. The coefficient multiplying circuit 62 operates to multiply the "m" inputs by predetermined different coefficients, respectively, and to output "m" multiplied digital signals to a third selector 64. This third selector 64 is controlled by the controller 66 to select one among the "m" received multiplied digital signals. The selected one multiplied digital signal constitutes a digital output signal which is outputted through an output terminal 68 with the sample frequency $f_o$.

Thus, the analog amplifier section 52 generates the "n" analog signals amplified by different amplification factors or gains $G_{a1}, G_{a2}, \ldots G_{an}$. The "n" analog signals respectively amplified by the gains $G_{a1}, G_{a2}, \ldots G_{an}$ are alternatively selected by the first selector 54 in synchronism with the clock of the frequency $Af_o$ (where $A \geq n$). The A/D converter 56 operates to convert the received analog signal into a digital signal in synchronism with the clock of the frequency $Af_o$. The second selector 58 distributes the digital signal into the "m" outputs in synchronism with the clock of the frequency $Af_o$, (where $A \geq m$). The coefficient multiplying circuit 62 operates to multiply the "m" received digital signals by different coefficients or gains $G_{k1}, G_{k2}, \ldots G_{km}$, respectively, so that, if the input analog signal 50 is at a constant level, all the outputs of the coefficient multiplying circuit 62 have substantially the same level.

Here, assume that the amplified analog signal "i" selected by the first selector 54 was amplified by the gain $G_{ai}$, the third selector 64 is controlled to select the output of the coefficient multiplying circuit 62 that has been obtained by amplifying the received digital signal by the coefficient or gain $G_{kj}$:

$$G_{kj} = a \cdot (1 / G_{ai})$$

where a is a real number and i and j are integer.

Further, if the third selector is required to output the digital signal as a sample clock having the frequency $f_o$, the sample clock generated by the sample clock generator 60 is needed to have a frequency $f_s$ which fulfills the following relation:

$$f_s = A \cdot f_o$$

where $A \geq n$, $A \geq m$ and n, m and A are integer.

As seen from the above explanation, the analog signal is amplified with at least two different amplification rates, and the at least two amplified analog signals are converted into a corresponding number of digital signals. If the input analog signal is at a relatively low level, a digital signal obtained from the analog signal amplified with a high amplification rate is selected and outputted as a digitized signal. On the other hand, if the input analog signal is at a relatively high level, a digital signal obtained from the analog signal amplified with a low amplification rate (including an amplification rate of "1") is selected and modified in a digital manner such as the shift of a digital data. The modified digital signal is outputted as a digitized signal. Therefore, the digitized signal can be obtained by using an A/D converter having a resolution lower than required resolution of the final digitized signal.

The invention has thus been shown and described with reference to the specific embodiments. However, it should be noted that the present invention is in no way limited to the details of the illustrated structures but changes and modifications may be made within the scope of the appended claims.

We claim:

1. An analog-digital converting circuit comprising an analog signal input terminal; analog amplifying means having an input connected to the analog signal input terminal and having a plurality of outputs for generating a corresponding number of analog signals amplified by different amplification factors; first selection means having a corresponding number of inputs connected to receive the plurality of amplified analog signals outputted from the analog amplifying means, respectively, and having an output for outputting one analog signal selected from the received amplified analog signals; an analog-digital converter having an input connected to receive the amplified and selected analog signal and having an output for generating a digital signal; second selection means having an input connected to receive the digital signal from the analog-digital converter and having a plurality of outputs for outputting the received digital signal from one sequentially alternatively selected from the plurality of outputs; a sample clock generator for supplying a sample clock to the first and second selection means and the analog-digital converter so as to cause the first and second selection means and the analog-digital converter to operate in a manner timed to each other; coefficient multiplying means having a corresponding number of inputs connected to the plurality of outputs for generating a corresponding number of multiplied digital signals which are obtained by multiplying the plurality of outputs of the second selection means by different coefficients, respectively; a third selection means having a corresponding number of inputs connected to the plurality of outputs of the coefficient multiplying means so as to output, as a digital signal, one selected from the plurality of outputs of the coefficient multiplying means; and a controller having a corresponding number of inputs connected to the plurality of outputs of the second selection means, respectively, for monitoring respective levels of the plurality of outputs of the second selection means and for supplying a selection signal to the third selection means so as to cause the third selection means to select, from the plurality of outputs of the coefficient multiplying means, one multiplied digital signal in correspondence to a level of the analog signal inputted to the analog signal input terminal.

2. An analog-digital converting circuit claimed in claim 1 wherein the analog amplifying means generates "n" analog signals (where n is an integer) amplified by gains $G_{a1}, G_{a2}, \ldots G_{an}$, respectively, and the coefficient multiplying means has "m" outputs (where m is an integer), these outputs of the coefficient multiplying means having gains $G_{k1}, G_{k2}, \ldots G_{km}$, the third selector being controlled by the controller to select one output of the plurality of outputs of the coefficient multiplying means so that the selected output has been multiplied in the coefficient multiplying means by a gain $G_{kj}$, which fulfills the following relation:

$$G_{kj} = \alpha \cdot (1/G_{ai})$$

where $\alpha$ is a real number and i and j are integers.

3. An analog-digital converting circuit claimed in claim 1 wherein the analog amplifying means generates "n" analog signals (where n is an integer) amplified by gains $G_{a1}, G_{a2}, \ldots G_{an}$, respectively, and the coefficient multiplying means has "m" outputs (where m is an integer), and the third selection means outputs the digital signal at a sample clock having a frequency $f_o$, the sample clock generated by the sample clock generator having a frequency $f_s$ which fulfills the following relation:

$$f_s = A \cdot f_o$$

where $A \geq n$, $A \geq m$ and n, m and A are integers.

4. An analog-digital converting circuit comprising an analog signal input terminal; first and second analog amplifiers each having an input connected to the analog signal input terminal, the first analog amplifier having a "0" gain and the second analog amplifier having a predetermined gain; a multiplexor having a pair of inputs connected to receive outputs of the first and second analog amplifiers, respectively, and having an output for outputting one analog signal selected from the two received amplified analog signals; an analog-digital converter having an input connected to receive the amplifier and selected analog signal and having an output for generating a digital signal; a demultiplexor having an input connected to receive the digital signal from the analog-digital converter and having a pair of outputs for outputting the received digital signal from one output alternately selected from the pair of outputs; first and second multipliers connected to the pair of outputs of the the demultiplexor, the first multiplier having a predetermined multiplication factor and the second multiplier having a multiplication factor of "1"; a selector having a pair of inputs connected to respective outputs of the first and second multipliers so as to output, as a digital signal, one output selected from the outputs of the first and second multipliers; a sample clock generator for supplying a sample clock to the multiplexor, the analog-digital converter and the demultiplexor so as to cause the multiplexor, the analog-digital converter and the demultiplexor to operate in such a manner timed to each other that, when the first amplifier is selected by the multiplexor, the output of the analog-digital converter is supplied to the first multiplier by the demultiplexor, and when the second amplifier is selected by the multiplexor, the output of the analog-digital converter is supplied to the second multiplier by the demultiplexor; and a controller connected to the outputs of the demultiplexor, respectively, for monitoring respective levels of the outputs of the demultiplexor and for supplying a selector signal to the selector so as to cause the selection to select, from the outputs of the first and second multipliers, one multiplied digital signal in correspondence to a level of the analog signal, inputted to the analog signal input terminal.

* * * * *